(12) United States Patent
Yoshida

(10) Patent No.: US 8,692,607 B2
(45) Date of Patent: Apr. 8, 2014

(54) CONTROL CIRCUIT FOR AN INTERNAL VOLTAGE GENERATION CIRCUIT

(76) Inventor: Kenji Yoshida, Tokyo (JP)

( * ) Notice: Subject to any disclaimer, the term of this patent is extended or adjusted under 35 U.S.C. 154(b) by 125 days.

(21) Appl. No.: 13/277,728

(22) Filed: Oct. 20, 2011

(65) Prior Publication Data
US 2012/0112821 A1    May 10, 2012

(30) Foreign Application Priority Data

Nov. 5, 2010   (JP) ................................. 2010-249028

(51) Int. Cl.
*G05F 1/575*   (2006.01)
*G05F 1/46*    (2006.01)

(52) U.S. Cl.
USPC .............. 327/535; 327/538; 363/59; 365/226

(58) Field of Classification Search
None
See application file for complete search history.

(56) References Cited

U.S. PATENT DOCUMENTS

| 6,498,761 B2* | 12/2002 | Banba et al. .................. 365/226 |
| 6,545,529 B2* | 4/2003 | Kim .............................. 327/536 |
| 6,831,500 B2 | 12/2004 | Sato et al. |
| 7,564,717 B2 | 7/2009 | Sato et al. |
| 7,965,130 B1* | 6/2011 | Cook et al. ..................... 327/536 |
| 8,013,666 B1* | 9/2011 | Liu ............................... 327/536 |

FOREIGN PATENT DOCUMENTS

| JP | 2-156498 (A) | 6/1990 |
| JP | 2000-306380 (A) | 11/2000 |
| JP | 2004-147458 (A) | 5/2004 |
| JP | 2008-112507 (A) | 5/2008 |

* cited by examiner

*Primary Examiner* — Lincoln Donovan
*Assistant Examiner* — Terry L Englund
(74) *Attorney, Agent, or Firm* — Foley & Lardner LLP

(57) ABSTRACT

Sharp fluctuations of an internal voltage when an internal voltage generating circuit is activated or inactivated are prevented. The internal voltage generating circuit to supply the internal voltage generated from an external voltage to an internal power supply line, a control circuit to control an operation of the internal voltage generating circuit, and a voltage detection circuit to detect a level of a first voltage are included. When, for example, the internal voltage generating circuit is activated, the control circuit stepwise increases supply ability of the internal voltage at a first speed and when the internal voltage generating circuit is inactivated, the control circuit stepwise reduces the supply ability of the internal voltage at a second speed that is different from the first speed. Accordingly, wild fluctuations of the internal voltage when the internal voltage generating circuit is activated/inactivated can optimally be prevented for each case.

13 Claims, 13 Drawing Sheets

| VDD | SELa | SELb | SELc |
|---|---|---|---|
| <1.3V | L | L | H |
| 1.3≦vdd<1.45 | L | H | L |
| ≧1.45 | H | L | L |

FIG.7

|  | STAGE 200 | | STAGE 210 | | STAGE 220 | |
| --- | --- | --- | --- | --- | --- | --- |
|  | ON0 | EN0 | OFF0 | ON1 | EN1 | OFF1 | ON2 | EN2 | OFF2 |
| SELa | VDD | ST1 | EX1 | ST2 | ST4 | EX2 | ST8 | ST16 | EX3 |
| SELb | VDD | ST1 | EX1 | ST1 | ST2 | EX4 | ST4 | ST8 | EX6 |
| SELc | VDD | VDD | EX1 | ST1 | VDD | EX4 | ST2 | VDD | EX8 |

FIG.8

CONTROL CIRCUIT FOR AN INTERNAL VOLTAGE GENERATION CIRCUIT

BACKGROUND OF THE INVENTION

1. Field of the Invention

The present invention relates to a semiconductor device and a control method thereof, and in particular, relates to a semiconductor device containing an internal voltage generating circuit and a control method thereof.

2. Description of Related Art

A semiconductor device such as a DRAM (Dynamic Random Access Memory) may contain a circuit operating based on an internal voltage that is different from an external voltage supplied from outside. In such a semiconductor device, an internal voltage generating circuit that generates an internal voltage based on an external voltage is provided (see Japanese Patent Application Laid-Open Nos. 2008-112507, 2000-306380, H2-156498, and 2004-147458).

An internal voltage generating circuit described in Japanese Patent Application Laid-Open No. 2008-112507 or Japanese Patent Application Laid-Open No. 2000-306380 generates an internal voltage by operating a plurality of parallel-connected stages in parallel. An internal voltage generating circuit described in Japanese Patent Application Laid-Open No. H2-156498 generates an internal voltage by selectively operating a plurality of parallel-connected stages. An internal voltage generating circuit described in Japanese Patent Application Laid-Open No. 2004-147458 reduces a rapid change of voltage by shifting the start timing of operation between a plurality of parallel-connected stages.

The internal voltage generating circuit described in Japanese Patent Application Laid-Open No. 2008-112507 or Japanese Patent Application Laid-Open No. 2000-306380 uses a plurality of oscillator signals with different phases and generates an internal voltage by supplying each of these oscillator signals to the plurality of stages. Thus, the start timing of operation and the stop timing of operation in each stage are shifted by a difference of phase, but the timing serving as a reference for the operation start or operation stop is entirely common. Therefore, when the internal voltage generating circuit is activated or inactivated, the internal voltage may fluctuate sharply, damaging stability of the internal voltage. In the internal voltage generating circuit described in Japanese Patent Application Laid-Open No. 2004-147458, on the contrary, the timing serving as a reference for the operation start is shifted by using an edge counter, but no step is taken for the timing serving as a reference for the operation stop. Therefore, when the internal voltage generating circuit is inactivated, the internal voltage may fluctuate sharply.

The above problems become particularly noticeable in a wide-range semiconductor device in which the range of the available external voltage is wide. The reason therefor is as follows. In a wide-range semiconductor device, it is unavoidable to design an internal voltage generating circuit by assuming a case when the level of the actually used external voltage is the lower limit of the available external voltage. That is, it is necessary to design the voltage supply ability of an internal voltage generating circuit higher in advance. Thus, if the level of the actually used external voltage is, for example, the upper limit of the available external voltage, instead of the lower limit thereof, the voltage supply ability of the internal voltage generating circuit becomes excessive. As a result, the internal voltage may fluctuate due to activation and inactivation of the internal voltage generating circuit. Such a problem cannot be solved by internal voltage generating circuits described in Japanese Patent Application Laid-Open Nos. 2008-112507, 2000-306380, H2-156498, and 2004-147458.

SUMMARY

In one embodiment, there is provided a semiconductor device comprising: an oscillator that outputs an oscillator signal having a predetermined cycle; an internal voltage generating circuit including a plurality of stages that receive a first voltage and output a second voltage to a first node in common; a first voltage detection circuit that compares the second voltage on the first node with a first reference voltage to generate a first control signal; and a control circuit that supplies a plurality of second control signals to the internal voltage generating circuit, each of the stages operating based on an associated one of the second control signals, wherein the control circuit activates the second control signals in mutually different timing synchronized with the oscillator signal in response to a first transition of the first control signal, the control circuit inactivates the second control signals in mutually different timing synchronized with the oscillator signal in response to a second transition of the first control signal, and activation timings of the second control signals in response to the first transition are different from inactivation timings of the second control signals in response to the second transition.

In another embodiment, there is provided a semiconductor device comprising: an internal voltage generating circuit that supplies a second voltage generated from a first voltage to an internal power supply line; a control circuit that controls the internal voltage generating circuit; and a first voltage detection circuit that detects a level of the first voltage, wherein the internal voltage generating circuit generates the second voltage regardless of the level of the first voltage, the control circuit stepwise increases an ability of generating the second voltage at a first speed when the internal voltage generating circuit is to be activated, the control circuit stepwise reduces the ability of generating the second voltage at a second speed when the internal voltage generating circuit is to be inactivated, the control circuit adjusts the first speed more slowly in increasing proximity of the level of the first voltage detected by the first voltage detection circuit to the second voltage, and the control circuit adjusts the second speed faster in increasing proximity of the level of the first voltage detected by the first voltage detection circuit to the second voltage.

In still another embodiment, there is provided a control method of an internal voltage generating circuit comprising: providing the internal voltage generating circuit having a plurality of stages including at least first and second stages, each of the stages outputting a second voltage generated from a first voltage to an output node in common based on an oscillator signal having a predetermined cycle; starting pumping the first stage synchronized with a first edge of the oscillator signal when a first predetermined period passes after a first transition of a first control signal; starting pumping the second stage synchronized with a second edge of the oscillator signal when a second predetermined period passes after the first transition of the first control signal; stopping the pumping one of the first and second stages synchronized with a third edge of the oscillator signal when a third predetermined period passes after a second transition of the first control signal; and stopping the pumping other of the first and second stages synchronized with a fourth edge of the oscillator signal when a fourth predetermined period passes after the second transition of the first control signal, wherein the first to fourth predetermined periods are mutually different.

According to the present invention, wild fluctuations of the internal voltage when an internal voltage generating circuit is activated or inactivated can be prevented.

BRIEF DESCRIPTION OF THE DRAWINGS

The above and other features and advantages of the present invention will be more apparent from the following description of certain preferred embodiments taken in conjunction with the accompanying drawings, in which:

FIG. 7 shows a truth table of the decoder 333;

FIG. 8 is a table showing the relationship between the start signal ST and the stop signal EX;

DETAILED DESCRIPTION OF THE EMBODIMENTS

A representative example of the technical concept of the present invention will be described below. It will be understood that what is claimed by the present invention is not limited to such a technical concept and is set forth in the claims of the present invention. That is, the technical concept of the present invention is to generate a count value by counting an oscillator signal and to activate and inactivate a plurality of stages contained in an internal voltage generating circuit in response to mutually different count values. Activation and inactivation of the plurality of stages are each set independently of each other by different count values. Setting conditions thereof are also made different depending on the external voltage. That is, instead of sequentially activating a plurality of stages in first timing (first phase) simply by oscillator signals having different phases and sequentially inactivating the plurality of stages in the first timing (first phase), activation timing and inactivation timing of a plurality of stages are made different for operation based on different edges of a predetermined oscillator signal serving as a reference. Accordingly, a time of one period of the oscillator signal or longer can be provided between activation or inactivation of some stage and activation or inactivation of another stage and also the time can be adjusted by an integral multiple of the period of the oscillator signal.

Figure 1:
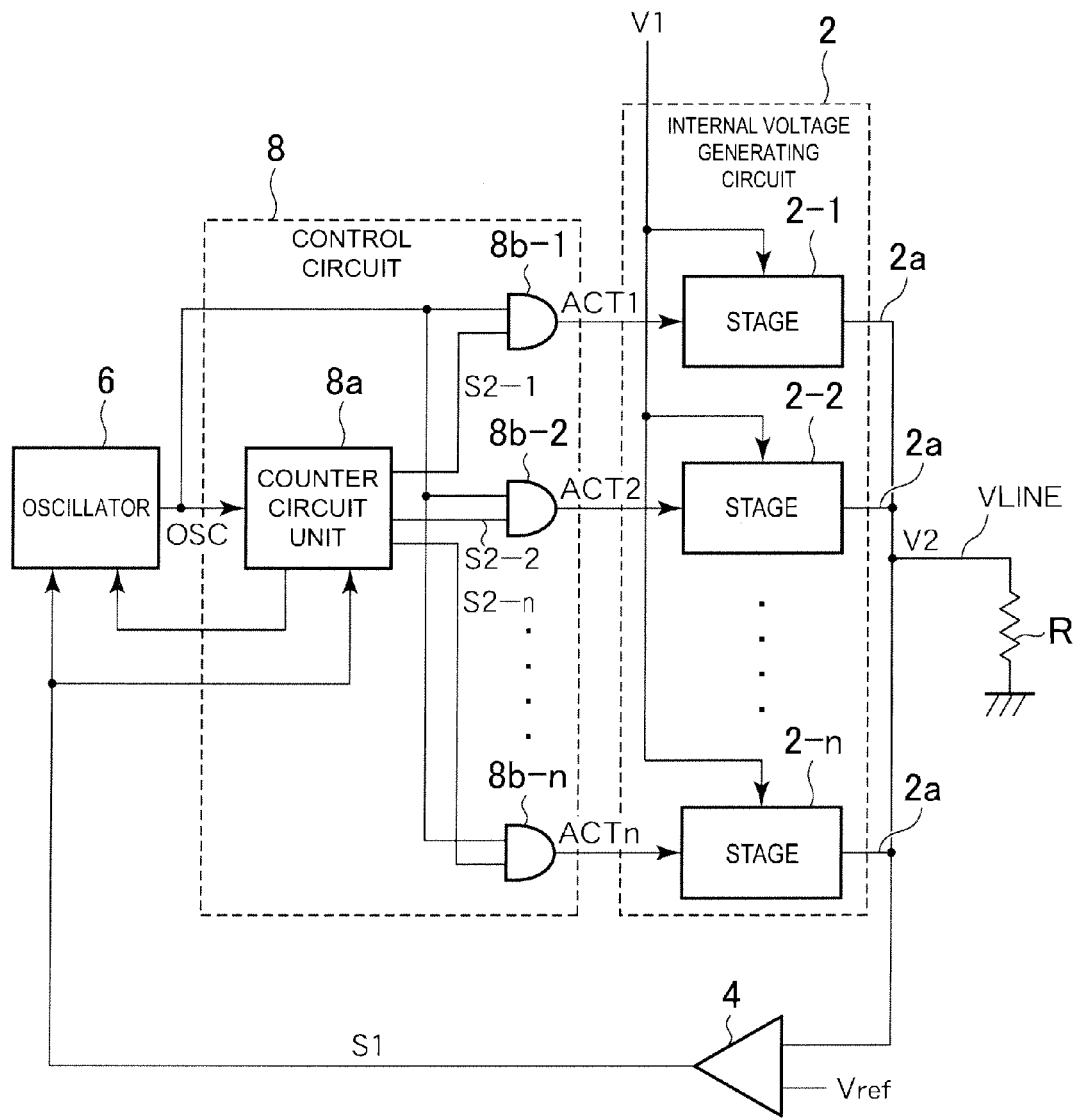
FIG. 1 is a schematic diagram illustrating the principle of the present invention.

FIG. 1 is a schematic diagram illustrating the principle of the present invention.

A semiconductor device according to the present invention receives a first voltage V1 and generates a second voltage V2 based on the first voltage V1. The voltage V1 is typically an external voltage. The voltage V2 is supplied to a predetermined load R in the semiconductor device via an internal power line VLINE. The relationship between the voltage V1 and the voltage V2 is not limited, but typically V1<V2.

The voltage V2 is generated by an internal voltage generating circuit 2. The internal voltage generating circuit 2 contains a plurality of stages 2-1 to 2-$n$. Output nodes 2$a$ of these stages 2-1 to 2-$n$ are connected to the internal power line VLINE in common. Each of the stages 2-1 to 2-$n$ is a circuit to generate the voltage V2 from the voltage V1 and operates independently of each other based on respective operation signals ACT1 to ACTn.

The voltage V2 generated by the internal voltage generating circuit 2 is supplied to a voltage detection circuit 4. The voltage detection circuit 4 compares the voltage V2 with a reference voltage Vref and supplies a first control signal S1 to an oscillator 6. When the control signal S1 is activated, the oscillator 6 supplies an oscillator signal OSC to a control circuit 8.

The control circuit 8 includes a counter circuit unit 8$a$ that counts the oscillator signal OSC. The counter circuit unit 8$a$ activates, in response to a predetermined value being indicated by the count value thereof, second control signals S2-1 to S2-$n$ corresponding to the count value. Then, when the control signal S1 is inactivated, the counter circuit unit 8$a$ inactivates, in response to a predetermined value further being indicated by the count value, the second control signals S2-1 to S2-$n$ corresponding to the count value and also stops the oscillator 6.

The control signals S2-1 to S2-$n$ are supplied to one input node of respective AND gate circuits 8$b$-1 to 8$b$-$n$. The oscillator signal OSC is supplied to the other input node of the AND gate circuits 8$b$-1 to 8$b$-$n$ in common. Outputs of the AND gate circuits 8$b$-1 to 8$b$-$n$ are used as operation signals ACT1 to ACTn, respectively and are supplied to the corresponding stages 2-1 to 2-$n$, respectively.

With the above configuration, if, for example, the voltage V2 falls below the reference voltage Vref, the control signal S1 is activated. Then the output of the oscillator signal OSC by the oscillator 6 is started. Accordingly, the count operation of the counter circuit unit is started and the control signals S2-1 to S2-$n$ are sequentially activated in accordance with the count value. The interval from when some control signal is activated and the next control signal is activated is an integral multiple of the period of the oscillator signal OSC. As a result, the stages 2-1 to 2-$n$ contained in the internal voltage generating circuit 2 are sequentially activated, raising the level of the voltage V2.

Then, when the voltage V2 exceeds the reference voltage Vref, the control signal S1 is inactivated. However, the output of the oscillator signal OSC by the oscillator 6 is not stopped immediately and the count operation by the counter circuit unit 8$a$ is continued. As a result, the control signals S2-1 to S2-$n$ are sequentially inactivated in accordance with the count value and then, the operation of the oscillator 6 is stopped. The interval from when some control signal is inactivated and the next control signal is inactivated is an integral multiple of the period of the oscillator signal OSC.

Thus, activation and inactivation of each stage 2$a$-1 to 2$a$-$n$ are controlled based on the count value that counts the oscillator signal OSC in the present invention. Therefore, the supply ability of the voltage V2 can stepwise be increased and also any speed of increase can be set. Similarly, the supply ability of the voltage V2 can stepwise be reduced and also any speed of reduction can be set. Accordingly, sharp fluctuations of the voltage V2 more likely to occur when the control signal S1 changes can be prevented.

Figure 2:
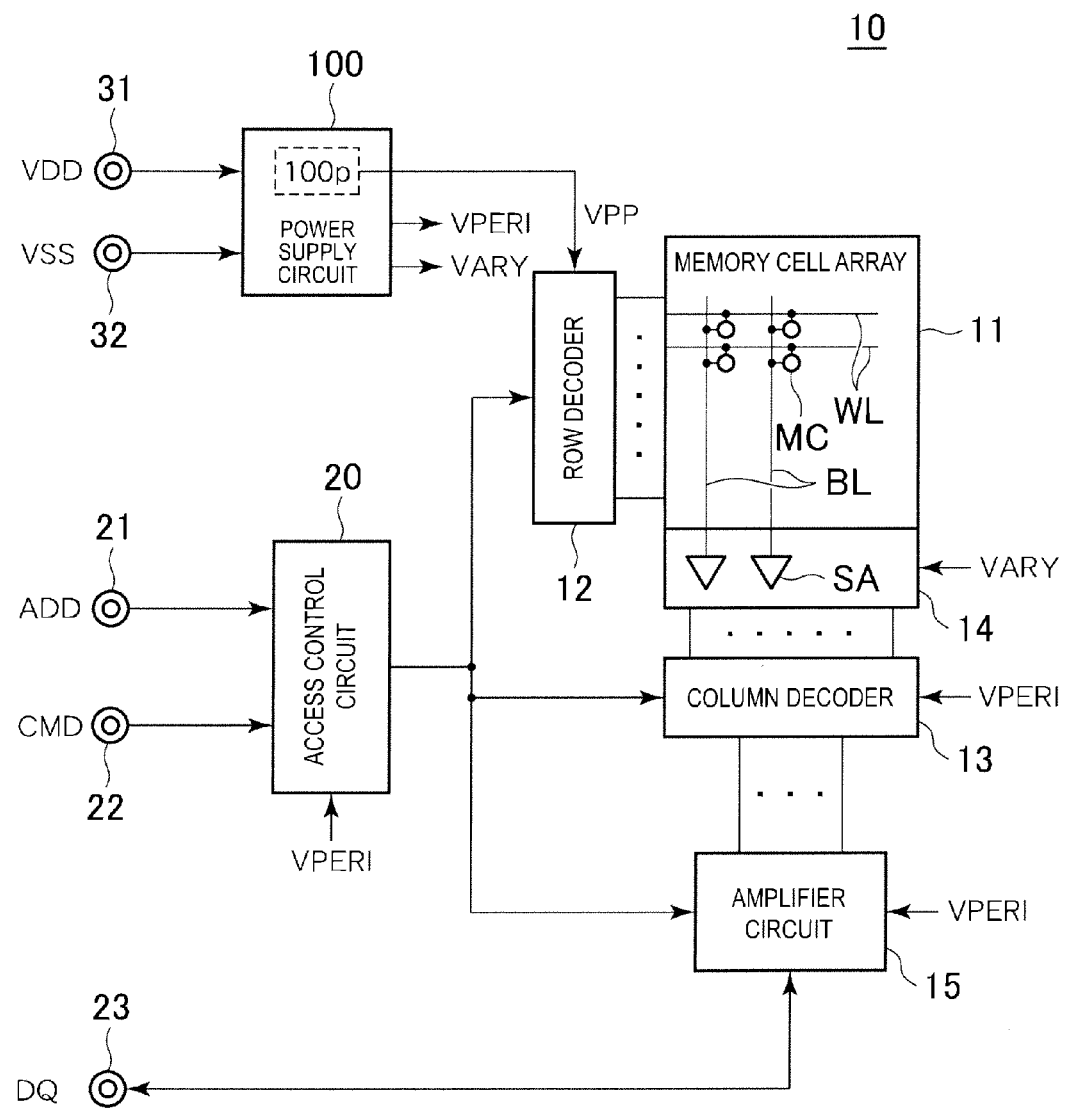
FIG. 2 is a block diagram showing the configuration of a semiconductor device 10 according to a preferred embodiment of the present invention.

FIG. 2 is a block diagram showing the configuration of the semiconductor device 10 according to a preferred embodiment of the present invention.

The semiconductor device 10 according to the present embodiment is a DRAM and includes, as shown in FIG. 2, a memory cell array 11. The memory cell array 11 is provided with a plurality of word lines WL, a plurality of bit lines BL intersecting with the word lines WL, and a plurality of memory cells MC each arranged at an intersection thereof. At least one of the word lines WL is selected by a row decoder 12. At least one of the bit lines BL is selected by a column decoder 13. The bit lines BL are connected to respective sense amplifiers SA in a sense circuit 14. The bit line BL selected by the column decoder 13 is electrically connected to an amplifier circuit 15 via the sense amplifier SA.

Operations of the row decoder 12 and the column decoder 13 are controlled by an access control circuit 20. The access control circuit 20 receives an address signal ADD and a command signal CMD supplied from outside via an address terminal 21 and a command terminal 22, respectively to control the row decoder 12 and the column decoder 13 based on the address signal ADD and the command signal CMD, respectively. The access control circuit 20 also controls the operation of the amplifier circuit 15.

More specifically, when the command signal CMD indicates an active operation, the address signal ADD is supplied to the row decoder 12. In response thereto, the row decoder 12 selects at least one of the word lines WL indicated by the address signal ADD and the corresponding memory cell MC is thereby connected to the respective bit line BL. When the command signal CMD indicates a read operation or write operation, the address signal ADD is supplied to the column decoder 13. In response thereto, the column decoder 13 electrically connects at least one of the bit lines BL indicated by the address signal ADD to the amplifier circuit 15. Therefore, when the command signal CMD indicates a read operation, read data DQ read from the memory cell array 11 via the sense amplifier SA is output to the outside from a data terminal 23 via the amplifier circuit 15. On the other hand, when the command signal CMD indicates a write operation, the write data DQ supplied from outside via the data terminal 23 is written into the memory cell MC via the amplifier circuit 15 and the sense amplifier SA.

Each of these circuit blocks uses a predetermined internal voltage as an operating power supply. These internal power supplies are generated by a power supply circuit 100 shown in FIG. 2. The power supply circuit 100 receives an external potential VDD and a ground potential VSS supplied via power supply terminals 31 and 32, respectively to generate internal voltages VPP, VPERI, VARY and the like based on these potentials. VDD, VPP, VPERI, and VARY herein indicate, in addition to the level of the relevant potential, a potential difference (voltage) with respect to the ground potential VSS. For example, "VDD" indicates, in addition to the potential level of the external potential VDD, a potential difference (voltage) with respect to the ground potential VSS. This also applies to VPP, VPERI, and VARY. In the present embodiment,

VPP>VDD22 VPERI≈VARY holds.

The internal voltage VPP is a voltage used by the row decoder 12. The row decoder 12 drives the selected word line WL to a VPP level based on the address signal ADD, thereby turning on a cell transistor contained in the memory cell MC. The internal voltage VPP is generated by a circuit block 100$p$ included in the power supply circuit 100. The internal voltage VARY is a voltage used by the sense circuit 14. When the sense circuit 14 is activated, read data that has been read from the memory cell array 11 is amplified by driving one of a pair of bit lines to a VARY level and the other to a VSS level. The internal voltage VPERI is used as an operation voltage of most of peripheral circuits such as the access control circuit 20. Lower power consumption is sought by using the internal voltage VPERI that is lower than VDD as an operating voltage of these peripheral circuits.

Figure 3:
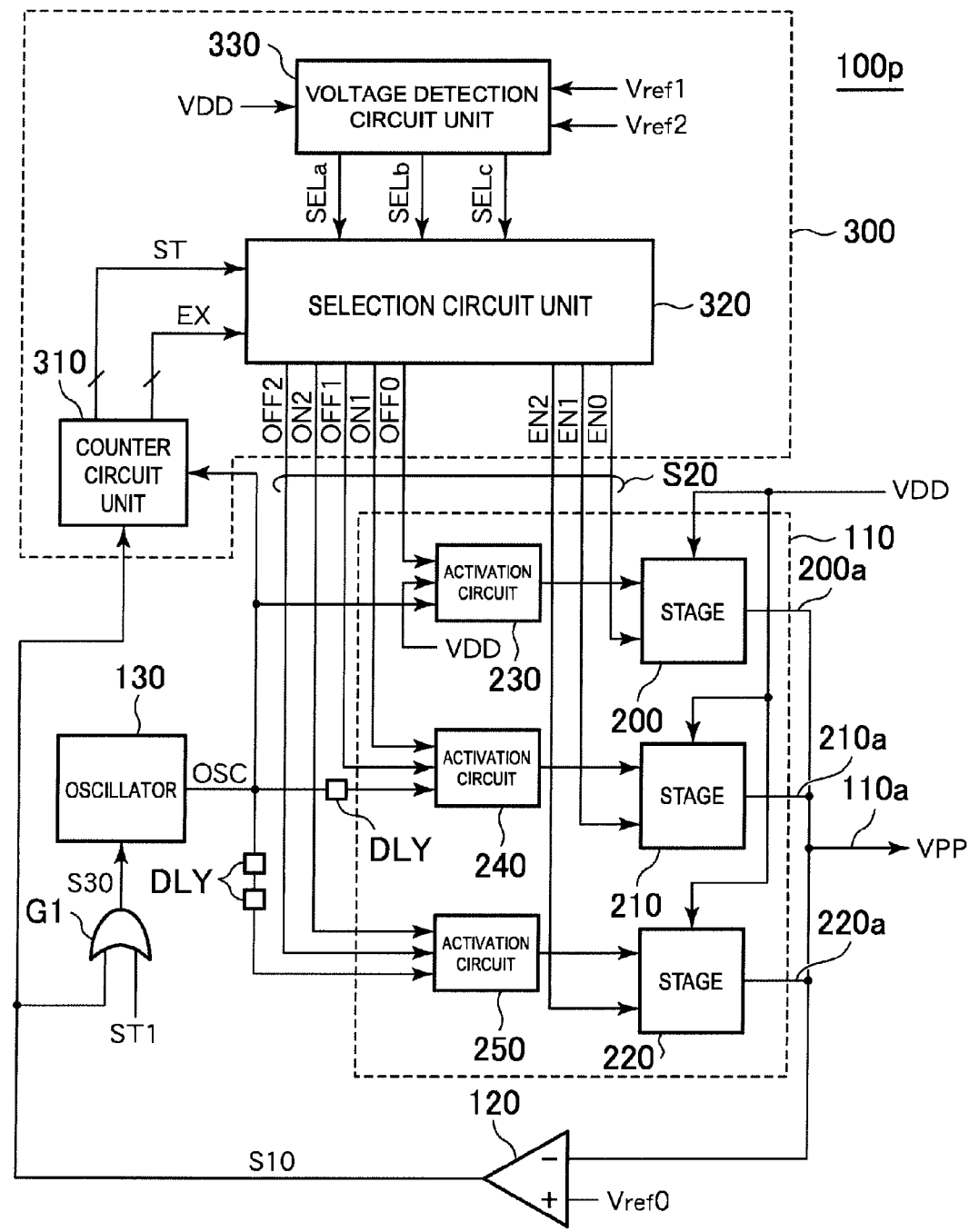
FIG. 3 is a block diagram showing a circuit block 100$p$.

FIG. 3 is a block diagram showing a circuit block 100$p$ that generates the internal voltage VPP.

As shown in FIG. 3, the circuit block 100$p$ in the power supply circuit 100 includes an internal voltage generating circuit 110 that generates the internal voltage VPP from the external voltage VDD and outputs the internal voltage VPP to an internal power supply line 110$a$. The internal voltage generating circuit 110 contains three stages 200, 210, 220 that generate the internal voltage VPP. Output nodes 200$a$, 210$a$, 220$a$ thereof are connected to the internal power supply line 110$a$ in common. Corresponding activation circuits 230, 240, 250 are provided in the previous stage of the stages 200, 210, 220, respectively. The activation circuits 230, 240, 250 are circuits that control activation/inactivation of the corresponding stages 200, 210, 220, respectively.

The circuit block 100$p$ further includes a voltage detection circuit 120, an oscillator 130, and a control circuit 300. The voltage detection circuit 120 is a circuit that compares the internal voltage VPP appearing in the internal power supply line 110$a$ with a reference voltage Vref0 and outputs a comparison result as a control signal S10. More specifically, if the internal voltage VPP is higher than the reference voltage Vref0, the control signal S10 is inactivated to a low level. If the internal voltage VPP is lower than the reference voltage Vref0, the control signal S10 is activated to a high level. The control signal S10 may herein be called a "first control signal".

The control signal S10 is supplied to the control circuit 300, in addition to the oscillator 130 via an OR gate circuit G1. As shown in FIG. 3, the control circuit 300 includes a counter circuit unit 310, a selection circuit unit 320, and a voltage detection circuit unit 330 and generates a control signal S20 based on the operation of these circuit units. However, the voltage detection circuit unit 330 may belong to another circuit block, instead of being a portion of the control circuit 300. The control signal S20 contains start signals ON1, ON2, stop signals OFF0 to OFF2, and enable signals EN0 to EN2. In the present invention, the start signals ON1, ON2 and the stop signals OFF0 to OFF2 may be called "second control signals" and the enable signals EN0 to EN2 may be called "third control signals".

Figure 4:
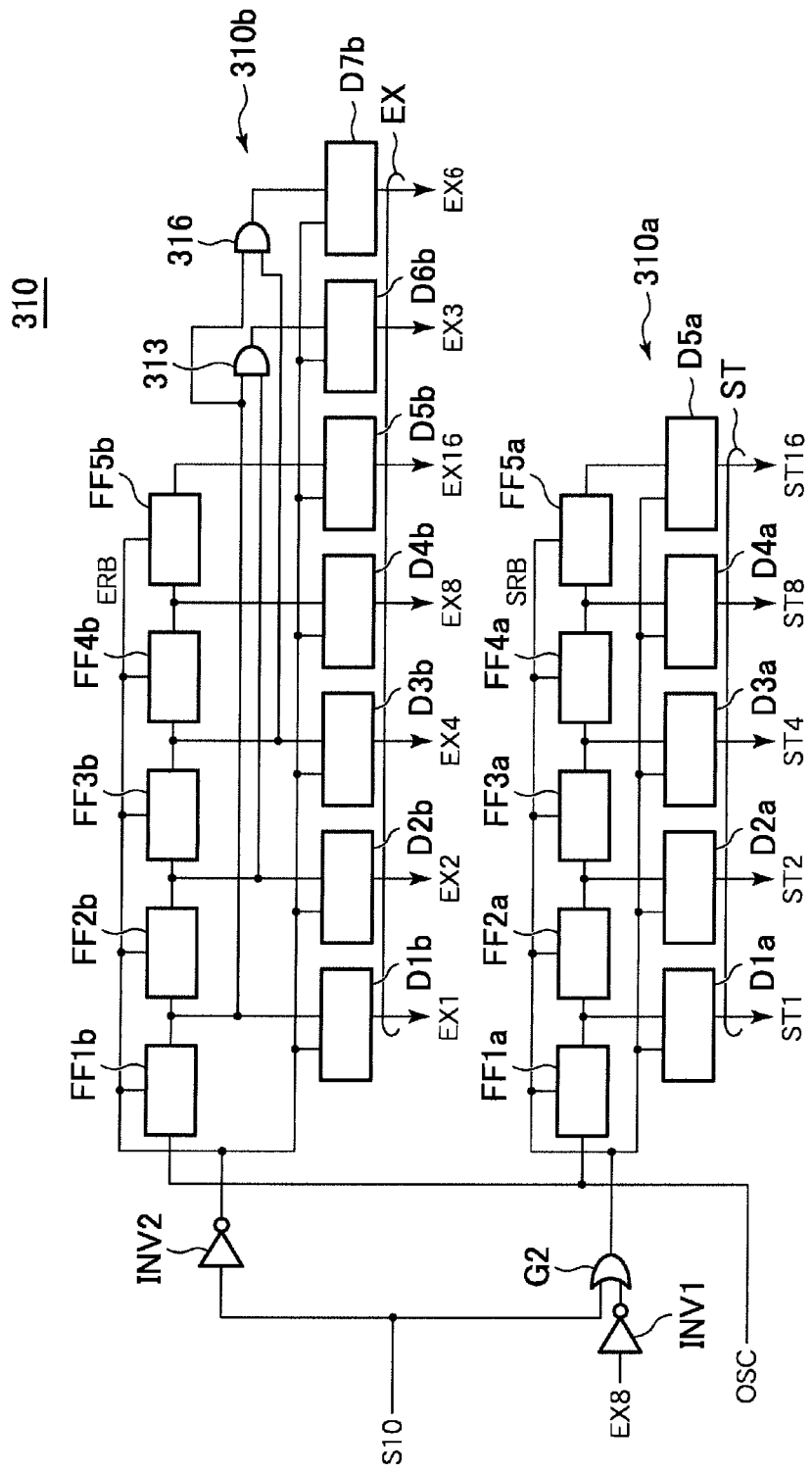
FIG. 4 is a circuit diagram of the counter circuit unit 310.

FIG. 4 is a circuit diagram of the counter circuit unit 310.

As shown in FIG. 4, the counter circuit unit 310 includes a start counter 310$a$ and an exit counter 310$b$. The start counter 310$a$ and the exit counter 310$b$ are each binary counters that count the oscillator signal OSC. The start counter 310$a$ performs the count operation when a reset signal SRB is at the high level and the exit counter 310$b$ performs the count operation when a reset signal ERB is at the high level. The reset signal SRB is the output signal of an OR gate circuit G2 that receives the control signal S10. Therefore, when the control signal S10 is activated to the high level, the start counter 310$a$ starts the count operation. The reset signal ERB is the output signal of an inverter INV2 that receives the control signal S10. Therefore, when the control signal S10 is inactivated to the low level, the exit counter 310$b$ starts the count operation.

The start counter 310$a$ includes cascade-connected flip-flops FF1$a$ to FF5$a$. Outputs of the flip-flops FF1$a$ to FF5$a$ are supplied to corresponding edge detection circuits D1a to D5a, respectively. The edge detection circuits D1a to D5a are activated by the high-level reset signal SRB and activate start signals ST1, ST2, ST4, ST8, ST16 in response to the output of the corresponding flip-flops FF1a to FF5a being changed to the high level, respectively. With the above configuration, each time the count value of the start counter 310a shows 1, 2, 4, 8, or 16, the start signal ST1, ST2, ST4, ST8, or ST16 is activated, respectively.

The exit counter 310b includes cascade-connected flip-flops FF1b to FF5b. Outputs of the flip-flops FF1b to FF5b are supplied to corresponding edge detection circuits D1b to D5b, respectively. The edge detection circuits D1b to D5b are activated by the high-level reset signal ERB and activate stop signals EX1, EX2, EX4, EX8, EX16 in response to the output of the corresponding flip-flops FF1b to FF5b being changed to the high level, respectively. With the above configuration, each time the count value of the exit counter 310b shows 1, 2, 4, 8, or 16, the stop signals EX1, EX2, EX4, EX8, or EX16 is activated, respectively. In the present embodiment, however, the stop signal EX16 is not used.

Further, the exit counter 310b includes a logical circuit 313 to detect the count value=3 and a logical circuit 316 to detect the count value=6 and outputs of these logical circuits 313 and 316 are supplied to corresponding edge detection circuits D6b and D7b. The edge detection circuits D6b and D7b are also activated by the reset signal ERB. Accordingly, stop signals EX3 and EX6 are activated each time the count value of the exit counter 310b indicates 3 and 6, respectively.

Further, the stop signal EX8 is supplied to the OR gate circuit G2 via an inverter INV1. Accordingly, even if the control signal S10 is inactivated, the start counter 310a continues the count operation until the stop signal EX8 is activated to the high level. This is because even if the control signal S10 changes to the low level in a short time after being activated to the high level, a series of operations described later are allowed to be performed to the end. The stop signal Ex8 is, among stop signals used in the present embodiment, the stop signal to be activated at the latest. Therefore, when the stop signal EX16 is used, the stop signal EX16 may be supplied to the OR gate circuit G2, instead of the stop signal EX8.

The start signal ST1 is supplied to the OR gate circuit G1 shown in FIG. 3. Accordingly, even if the control signal S10 changes to the low level in a short time after being activated to the high level, a control signal S30 to activate the oscillator 130 is maintained at the high level. As a result, the operation of the oscillator 130 is maintained and a series of operations are performed to the end.

The start signals ST1, ST2, ST4, ST8, ST16 and the stop signals EX1, EX2, EX4, EX8, EX16, EX3, EX6 generated by the counter circuit unit 310 are supplied to the selection circuit unit 320.

Figure 5:
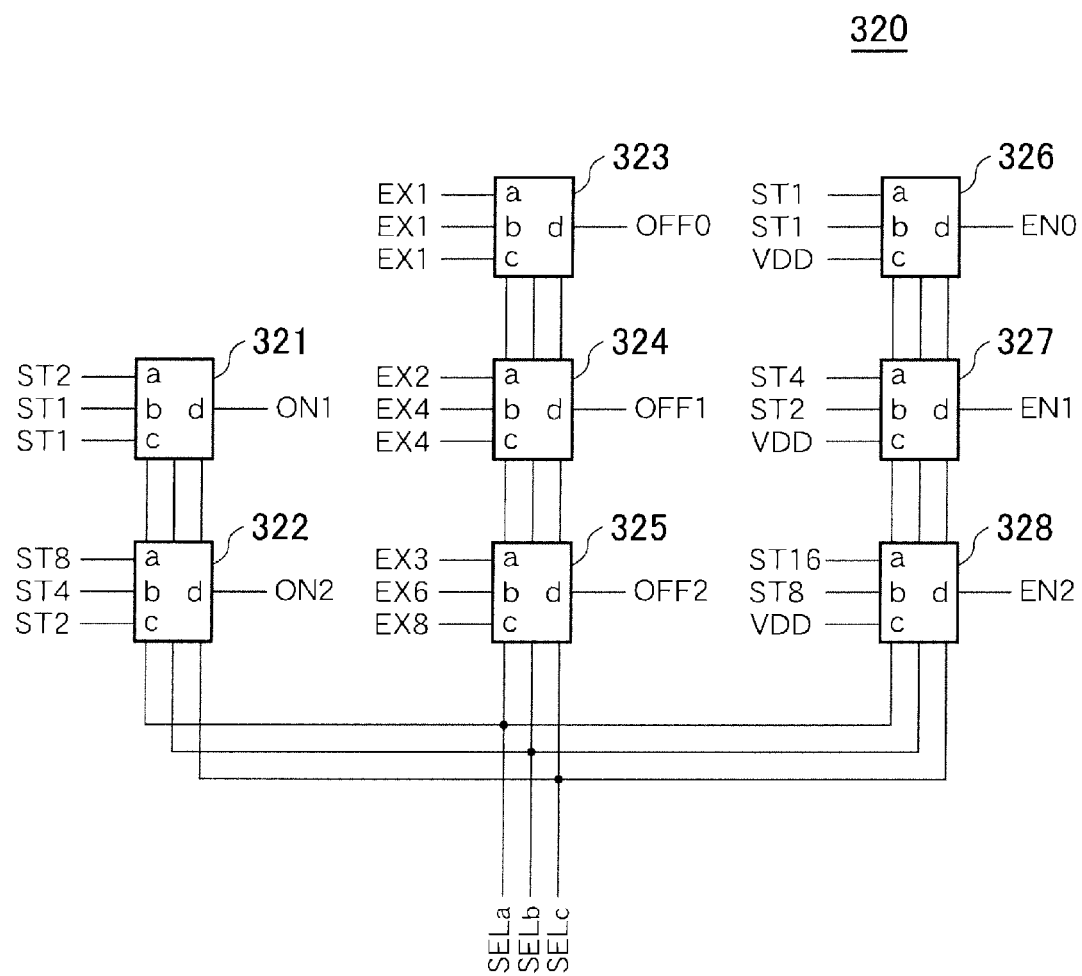
FIG. 5 is a circuit diagram of the selection circuit unit 320.

FIG. 5 is a circuit diagram of the selection circuit unit 320.

The selection circuit unit 320 is composed of multiplexers 321 to 328 that generates the start signals ON1, ON2, the stop signals OFF0 to OFF2, and the enable signals EN0 to EN2, respectively. Each of these multiplexers 321 to 328 includes three input nodes a, b, c and one output node d. Each of the multiplexers 321 to 328 outputs a signal supplied to the input node a from the output node d when a selection signal SELa is activated, outputs a signal supplied to the input node b from the output node d when a selection signal SELb is activated, and outputs a signal supplied to the input node c from the output node d when a selection signal SELc is activated.

As shown in FIG. 5, the start signals ST2, ST1, ST1 are supplied to the input nodes a, b, c of the multiplexer 321, respectively and the start signal ON1 is output from the output node d. The start signals ST8, ST4, ST2 are supplied to the input nodes a, b, c of the multiplexer 322, respectively and the start signal ON2 is output from the output node d.

The stop signal EX1 is supplied to the input nodes a, b, c of the multiplexer 323 and the stop signal OFF0 is output from the output node d. The stop signals EX2, EX4, EX4 are supplied to the input nodes a, b, c of the multiplexer 324, respectively and the stop signal OFF1 is output from the output node d. The stop signals EX3, EX6, EX8 are supplied to the input nodes a, b, c of the multiplexer 325, respectively and the stop signal OFF2 is output from the output node d.

The start signals ST1, ST1 and VDD are supplied to the input nodes a, b, c of the multiplexer 326, respectively and the enable signal EN0 is output from the output node d. The start signals ST4, ST2 and VDD are supplied to the input nodes a, b, c of the multiplexer 327, respectively and the enable signal EN1 is output from the output node d. The start signals ST16, ST8 and VDD are supplied to the input nodes a, b, c of the multiplexer 328, respectively and the enable signal EN2 is output from the output node d.

The start signals ON1 and ON2, the stop signals OFF0 to OFF2, and the enable signals EN0 to EN2 generated in this manner are supplied, as shown in FIG. 3, to the internal voltage generating circuit 110. More specifically, the start signals ON1, ON2 are supplied to the activation circuits 240, 250, respectively, the stop signals OFF0 to OFF2 are supplied to the activation circuits 230, 240, 250, respectively, and the enable signals EN0 to EN2 are supplied to the stages 200, 210, 220, respectively.

Figure 6:
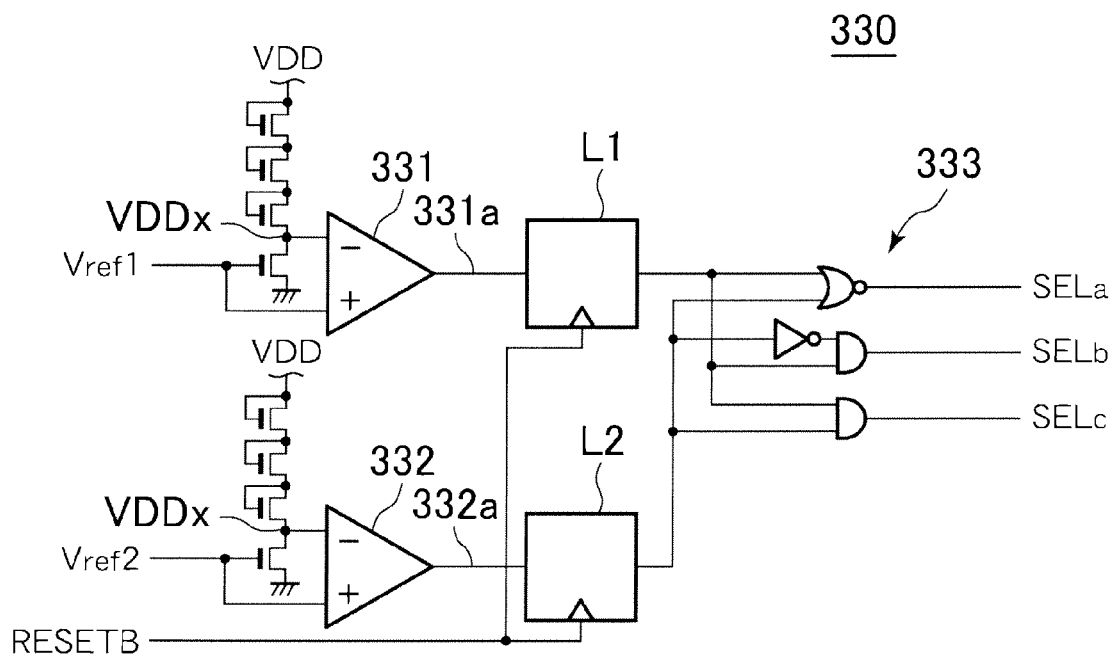
FIG. 6 is a circuit diagram of the voltage detection circuit unit 330.

FIG. 6 is a circuit diagram of the voltage detection circuit unit 330.

As shown in FIG. 6, the voltage detection circuit unit 330 includes voltage detection circuits (comparison units) 331 and 332 that compare a voltage VDDx obtained by stepping down the external voltage VDD to ¼ with the reference voltages Vref1 and Vref2, respectively. The reference voltage Vref1 is a voltage obtained by stepping down a threshold VH to ¼. The reference voltage Vref2 is a voltage obtained by stepping down a threshold VL (<VH) to ¼. Thus, if the external voltage VDD is higher than the threshold VH, outputs 331a and 332a of the voltage detection circuits 331 and 332 are both at the low level. If the external voltage VDD is lower than the threshold VL, the outputs 331a and 332a of the voltage detection circuits 331 and 332 are both at the high level. If the external voltage VDD is between the threshold VL and the threshold VH, the output 331a of the voltage detection circuit 331 is at the high level and the output 332a of the voltage detection circuit 332 is at the low level.

The output signals 331a and 332a of the voltage detection circuits 331 and 332 generated as described above are supplied to a decoder 333 via latch circuits L1 and L2, respectively. The latch circuits L1 and L2 are circuits to latch the outputs 331a and 332a, respectively in synchronization with a reset signal RESETB supplied from outside during initialization after power-on. These latch circuits L1 and L2 are interposed therebetween to prevent the output signal of the decoder 333 from changing when the voltage temporarily fluctuate during normal operation after initialization.

The decoder 333 decodes the outputs 331a and 332a to activate one of the selection signals SELa to SELc. FIG. 7 shows a truth table of the decoder 333. As shown in FIG. 7, the selection signal SELa is activated when the external voltage VDD is higher than the threshold VH, the selection signal SELb is activated when the external voltage VDD is between the threshold VL and the threshold VH, and the selection signal SELc is activated when the external voltage VDD is lower than the threshold VL. In the present invention, the selection signals SELa to SELc may be called "fourth control signals".

The threshold VH is set a little lower than the upper limit of the available external voltage VDD and the threshold VL is set a little higher than the lower limit of the available external voltage VDD. As an example, if the upper limit of the available external voltage VDD is 1.5 V and the lower limit thereof is 1.2 V, it is preferable to set the levels of the thresholds VH and VL to about 1.45 V and 1.30 V, respectively. In this case, the selection signal SELa is activated if the level of the actually applied external voltage VDD is 1.5 V, the selection signal SELb is activated if the level of the external voltage VDD is 1.35 V, and the selection signal SELc is activated if the level of the external voltage VDD is 1.2 V.

FIG. 8 is a table showing the relationship between the start signal ST and the stop signal EX used with the control signal S20 for each selection signal SEL.

When, as shown in FIG. 8, the selection signal SELa is activated, the enable signal EN0 and the stop signal OFF0 corresponding to the stage 200 become the same signals as the start signal ST1 and the stop signal EX1, respectively, the start signal ON1, the enable signal EN1, and the stop signal OFF1 corresponding to the stage 210 become the same signals as the start signals ST2, ST4 and the stop signal EX2, respectively, and the start signal ON2, the enable signal EN2, and the stop signal OFF2 corresponding to the stage 220 become the same signals as the start signals ST8, ST16 and the stop signal EX3, respectively.

When the selection signal SELb is activated, the enable signal EN0 and the stop signal OFF0 corresponding to the stage 200 become the same signals as the start signal ST1 and the stop signal EX1, respectively, the start signal ON1, the enable signal EN1, and the stop signal OFF1 corresponding to the stage 210 become the same signals as the start signals ST1, ST2 and the stop signal EX4, respectively, and the start signal ON2, the enable signal EN2, and the stop signal OFF2 corresponding to the stage 220 become the same signals as the start signals ST4, ST8 and the stop signal EX6, respectively.

Further, when the selection signal SELc is activated, the enable signal EN0 and the stop signal OFF0 corresponding to the stage 200 become the same signals as the high level and the stop signal EX1, respectively, the start signal ON1, the enable signal EN1, and the stop signal OFF1 corresponding to the stage 210 become the same signals as the start signal ST1, high level, and the stop signal EX4, respectively, and the start signal ON2, the enable signal EN2, and the stop signal OFF2 corresponding to the stage 220 become the same signals as the start signals ST2, high level, and the stop signal EX8, respectively.

Figure 9:
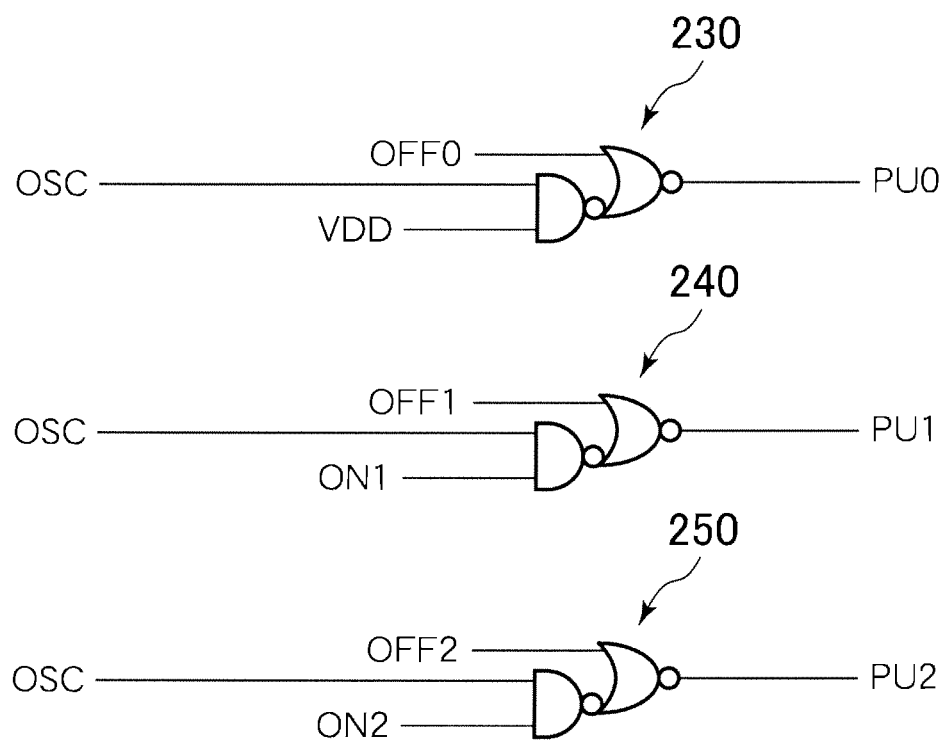
FIG. 9 is a circuit diagram of the activation circuits 230, 240 and 250.

FIG. 9 is a circuit diagram of the activation circuits 230, 240 and 250.

As shown in FIG. 9, each of the activation circuits 230, 240, 250 is composed of a NAND gate circuit and a NOR gate circuit. The oscillator signal OSC and the start signal ON (or the high level) are supplied to the NAND gate circuit unit and the output of the NAND gate circuit unit and the stop signal OFF are supplied to the NOR gate circuit. Accordingly, when the start signal ON input into the NAND gate circuit unit is activated to the high level, pump signals PU0 to PU2 that are outputs thereof have the same waveform as the oscillator signal OSC. When the stop signal OFF input into the NOR gate circuit unit is activated to the high level, the pump signals PU0 to PU2 that are outputs thereof are fixed to the low level.

The input of the NAND gate circuit unit in the activation circuit 230 is fixed to the high level and thus, when the oscillator signal OSC is supplied, the pump signal PU0 is immediately generated and then, when the stop signal OFF0 is activated, the pump signal PU0 is stopped. After the oscillator signal OSC being supplied, the activation circuits 240, 250 generate the pump signals PU1, PU2 in response to activation of the start signals ON1, ON2 and then, when the stop signals OFF1 and OFF2 are activated, stop the pump signals PU1, PU2, respectively.

The oscillator signal OSC supplied to the activation circuits 230, 240, 250 may mutually have the same signal, but the oscillator signal OSC preferably has mutually different phases. When the oscillator signals having mutually different phases are used, as shown in FIG. 3, a delay circuit DLY may be inserted into a signal bus of the oscillator signal OSC.

Figure 10:
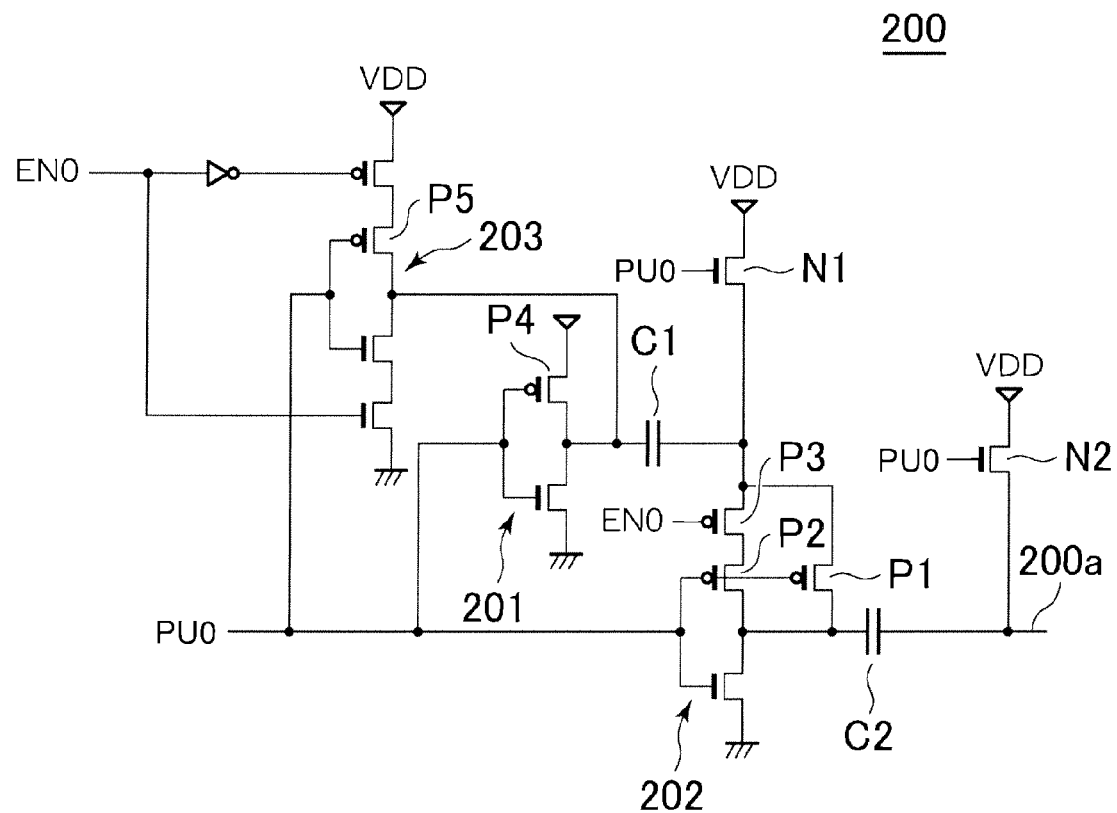
FIG. 10 is a circuit diagram of the stage 200.

FIG. 10 is a circuit diagram of the stage 200.

The stage 200 is a so-called step-up pump circuit and includes inverters 201 and 202 into which the pump signal PU0 is supplied, capacitors C1, C2, and transistors N1, N2. A P-channel MOS transistor contained in the inverter 202 is divided into transistors P1, P2 and while the transistor P1 is directly connected to the capacitor C1, the transistor P2 is connected to the capacitor C1 via a transistor P3. The enable signal EN0 is supplied to the gate of the transistor P3. The channel width of the transistor P2 is designed larger than the channel width of the transistor P1 and thus, the transistor P2 has higher current driving capabilities.

The capacitor C1 is connected to between an output node of the inverter 201 and a high-potential side power supply node of the inverter 202. The external voltage VDD is supplied to the higher-potential power supply node of the inverter 202 via the transistor N1. The capacitor C2 is connected to between the output node of the inverter 202 and an output node 200a of the stage 200. The external voltage VDD is supplied to the output node 200a of the stage 200 via the transistor N2.

With the above configuration, the outputs of the inverters 201, 202 are at the low level and the transistors N1, N2 are turned on in a period in which the pump signal PU0 are at the high level and thus, both ends of the capacitors C1, C2 are in a state of being charged at VDD. Then, when the pump signal PU0 changes to the low level, the outputs of the inverters 201, 202 change to the high level and thus, electric charges charged in the capacitors C1, C2 are pumped and a stepped-up voltage is supplied to the output node 200a. By repeating the above operation in synchronization with pump signal PU0, the output node 200a is stepped up.

Further, an inverter 203 activated by the enable signal EN0 is added to the stage 200. The channel width of a transistor P5 contained in the inverter 203 is designed larger than the channel width of the transistor P4 contained in the inverter 201 and thus, the transistor P5 has higher current driving capabilities.

Accordingly, if the enable signal EN0 is activated, the capacitor C1 is pumped by both of the inverter 201 and the inverter 203, increasing pumping ability. Further, if the enable signal EN0 is activated, the transistor P3 is also turned on and thus, pumping ability of the capacitor C2 is also increased. Therefore, when the enable signal EN0 is activated, the supply ability of the internal voltage VPP by the stage 200 is increased. In the present invention, a state in which supply ability of the internal voltage VPP is low because the enable signal EN0 is not activated may be called a "low-ability mode" and a state in which supply ability of the internal voltage VPP is high because the enable signal EN0 is activated may be called a "high-ability mode". A circuit portion controlled by the enable signal EN0 may be called a "switching unit".

The other stages 210, 220 also have basically the same circuit configuration as the circuit configuration of the stage 200 shown in FIG. 10.

The configuration of the semiconductor device 10 according to the present embodiment has been described above. The operation of the circuit block 100*p* that generates the internal voltage VPP will be described below.

Figure 11:
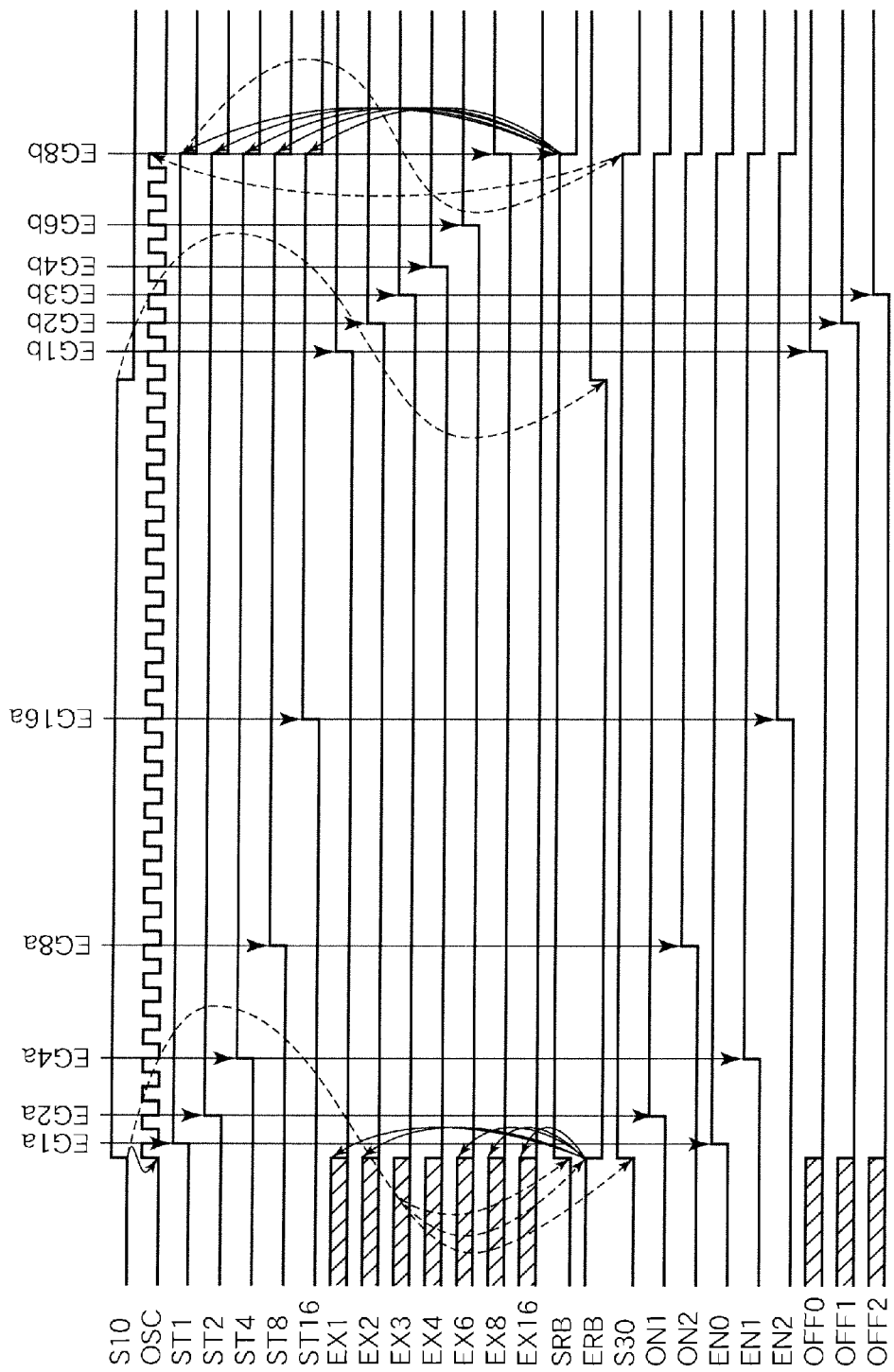
FIG. 11 is a timing diagram showing the operation when the selection signal SELa is activated.

FIG. 11 is a timing diagram showing the operation when the selection signal SELa is activated. The selection signal SELa is activated if the external voltage VDD is higher than the threshold VH.

If, as shown in FIG. 11, the control signal S10 is activated to the high level, the oscillator signal OSC is generated and the count operation by the start counter 310*a* is started. As a result, the start signals ST1, ST2, ST4, ST8, and ST16 are activated in synchronization with edges EG1*a*, EG2*a*, EG4*a*, EG8*a*, and EG16*a* of the oscillator signal OSC, respectively. The edges EG1*a*, EG2*a*, EG4*a*, EG8*a*, EG16*a* of the oscillator signal OSC are edges of the first cycle, second cycle, fourth cycle, eighth cycle, and 16-th cycle of the oscillator signal OSC after the control signal S10 being activated.

As described using FIG. 8, when the selection signal SELa is activated, the start signals ON1, ON2 corresponding to the stages 210, 220 are the same signals as the start signals ST2, ST8, respectively and thus, the operation of the stages 210, 220 is started in synchronization with the edges EG2*a*, EG8*a* of the oscillator signal OSC, respectively. The operation of the stage 200 is immediately started in synchronization with the oscillator signal OSC.

Further, if the selection signal SELa is activated, the enable signals EN0, EN1, EN2 corresponding to the stages 200, 210, 220 are the same signals as the start signals ST1, ST4, ST16, respectively and thus, the stages 200, 210, 220 are switched from the low-ability mode to the high-ability mode in synchronization with the edges EG1*a*, EG4*a*, EG16*a* of the oscillator signal OSC, respectively.

With the above control, the supply ability of the internal voltage VPP by the internal voltage generating circuit 110 is stepwise increased.

Then, when the level of the internal power supply line 110*a* exceeds Vref0 and the control signal S10 is thereby inactivated to the low level, the count operation by the exit counter 310*b* is started. As a result, the stop signals EX1, EX2, EX3, EX4, EX6, and EX8 are activated in synchronization with edges EG1*b*, EG2*b*, EG3*b*, EG4*b*, EG6*b*, and EG8*b* of the oscillator signal OSC. The edges EG1*b*, EG2*b*, EG3*b*, EG4*b*, EG6*b*, EG8*b* of the oscillator signal OSC are edges of the first cycle, second cycle, third cycle, fourth cycle, sixth cycle, and eighth cycle of the oscillator signal OSC after the control signal S10 being inactivated, respectively.

As described using FIG. 8, when the selection signal SELa is activated, the stop signals OFF0, OFF1, OFF2 corresponding to the stages 200, 210, 220 are the same signals as the stop signals EX1, EX2, EX3, respectively and thus, the operation of the stages 200, 210, 220 is stopped in synchronization with the edges EG1*b*, EG2*b*, EG3*b* of the oscillator signal OSC, respectively.

With the above control, the supply ability of the internal voltage VPP by the internal voltage generating circuit 110 is stepwise reduced.

Figure 12:
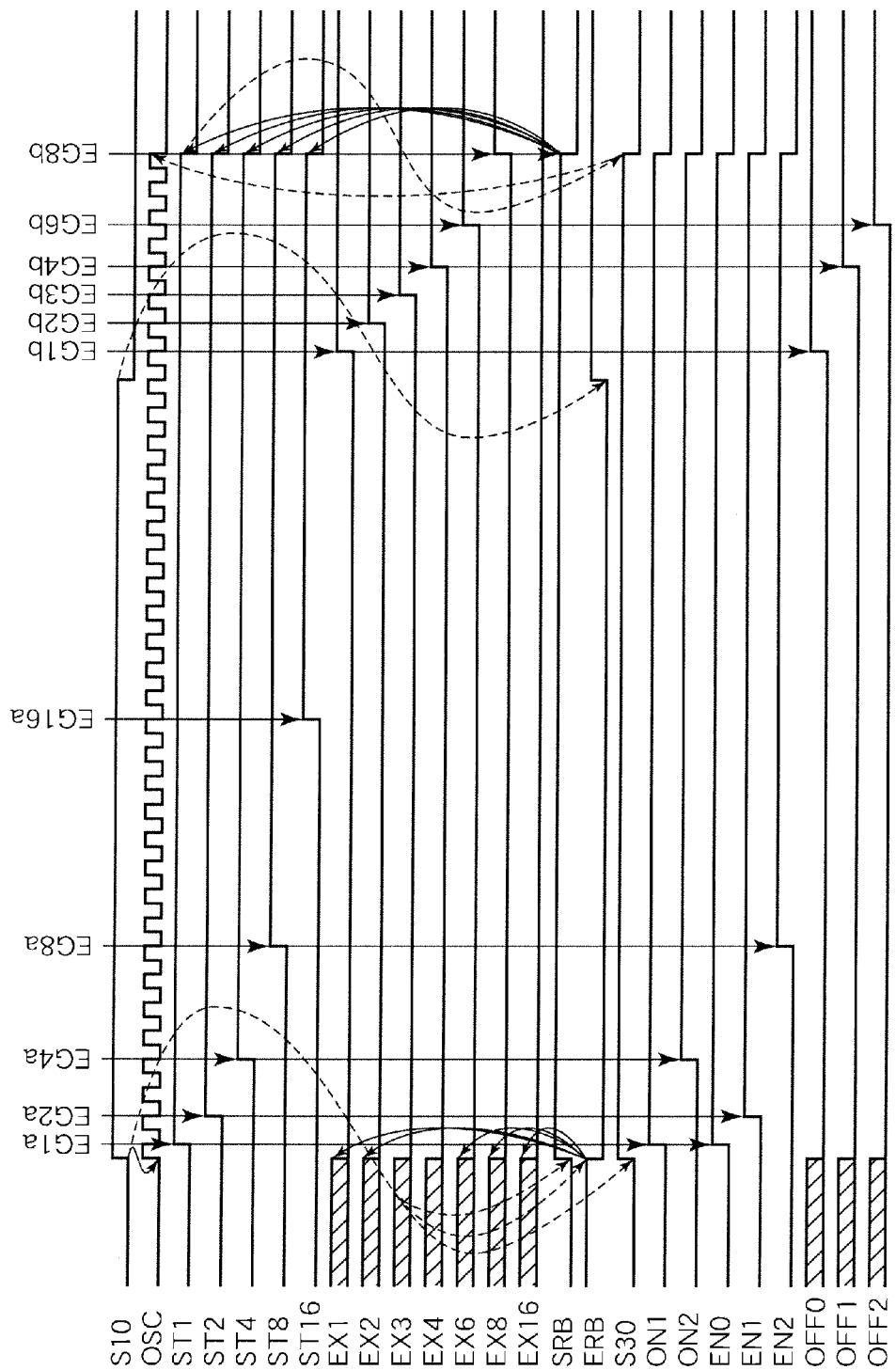
FIG. 12 is a timing diagram showing the operation when the selection signal SELb is activated.

FIG. 12 is a timing diagram showing the operation when the selection signal SELb is activated. The selection signal SELb is activated if the external voltage VDD is between the threshold VL and the threshold VH.

When the selection signal SELb is activated, the start signals ON1, ON2 corresponding to the stages 210, 220 are the same signals as the start signals ST1, ST4, respectively and thus, the operation of the stages 210, 220 is started in synchronization with the edges EG1*a*, EG4*a* of the oscillator signal OSC, respectively. The operation of the stage 200 is immediately started in synchronization with the oscillator signal OSC.

Further, if the selection signal SELb is activated, the enable signals EN0, EN1, EN2 corresponding to the stages 200, 210, 220 are the same signals as the start signals ST1, ST2, ST8, respectively and thus, the stages 200, 210, 220 are switched from the low-ability mode to the high-ability mode in synchronization with the edges EG1*a*, EG2*a*, EG8*a* of the oscillator signal OSC, respectively.

With the above control, the supply ability of the internal voltage VPP by the internal voltage generating circuit 110 is stepwise increased. In the example shown in FIG. 12, the speed at which the supply ability of the internal voltage VPP is increased is faster than in the example shown in FIG. 11. This is because the voltage of the external voltage VDD in the example shown in FIG. 12 is lower than that in the example shown in FIG. 11 and thus, it is necessary to increase the supply ability of the internal voltage VPP swiftly. Conversely, if the external voltage VDD is higher like in the example shown in FIG. 11, a sharp rise of the internal voltage VPP can be prevented by increasing the supply ability of the internal voltage VPP slowly.

Then, when the level of the internal power supply line 110*a* exceeds Vref0 and the control signal S10 is thereby inactivated to the low level, the count operation by the exit counter 310*b* is started. When the selection signal SELb is activated, the stop signals OFF0, OFF1, OFF2 corresponding to the stages 200, 210, 220 are the same signals as the stop signals EX1, EX4, EX6, respectively and thus, the operation of the stages 200, 210, 220 is stopped in synchronization with the edges EG1*b*, EG4*b*, EG6*b* of the oscillator signal OSC, respectively.

With the above control, the supply ability of the internal voltage VPP by the internal voltage generating circuit 110 is stepwise reduced. In the example shown in FIG. 12, the speed at which the supply ability of the internal voltage VPP is reduced is slower than in the example shown in FIG. 11. This is because the voltage of the external voltage VDD in the example shown in FIG. 12 is lower than that in the example shown in FIG. 11 and thus, fluctuations of the internal voltage VPP can be decreased by reducing the supply ability of the internal voltage VPP. Conversely, if the external voltage VDD is higher like in the example shown in FIG. 11, an excessive rise of the internal voltage VPP can be prevented by reducing the supply ability of the internal voltage VPP swiftly.

Figure 13:
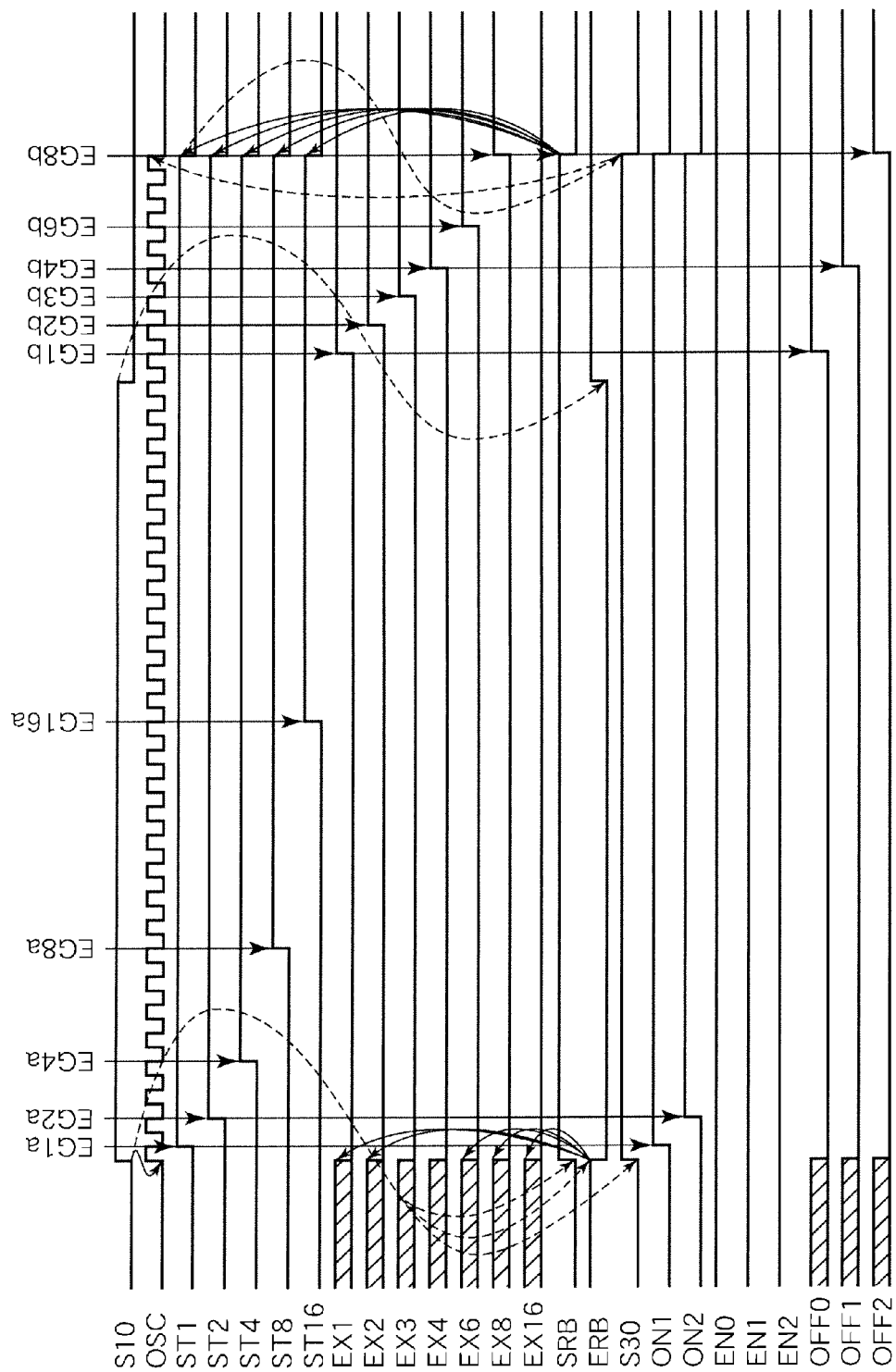
FIG. 13 is a timing diagram showing the operation when the selection signal SELc is activated.

FIG. 13 is a timing diagram showing the operation when the selection signal SELc is activated. The selection signal SELc is activated if the external voltage VDD is lower than the threshold VL.

When the selection signal SELc is activated, the start signals ON1, ON2 corresponding to the stages 210, 220 are the same signals as the start signals ST1, ST2, respectively and thus, the operation of the stages 210, 220 is started in synchronization with the edges EG1*a*, EG2*a* of the oscillator signal OSC, respectively. The operation of the stage 200 is immediately started in synchronization with the oscillator signal OSC.

Further, if the selection signal SELc is activated, the enable signals EN0, EN1, EN2 corresponding to the stages 200, 210, 220 are always activated and thus, the stages 200, 210, 220 operate in high-ability mode from the start.

With the above control, the supply ability of the internal voltage VPP by the internal voltage generating circuit 110 is stepwise increased. In the example shown in FIG. 13, the speed at which the supply ability of the internal voltage VPP is increased is still faster than in the example shown in FIG.

12. This is because the voltage of the external voltage VDD in the example shown in FIG. 13 is still lower than that in the example shown in FIG. 12 and thus, it is necessary to increase the supply ability of the internal voltage VPP more swiftly.

Then, when the level of the internal power supply line 110a exceeds Vref0 and the control signal S10 is thereby inactivated to the low level, the count operation by the exit counter 310b is started. When the selection signal SELc is activated, the stop signals OFF0, OFF1, OFF2 corresponding to the stages 200, 210, 220 are the same signals as the stop signals EX1, EX4, EX8, respectively and thus, the operation of the stages 200, 210, 220 is stopped in synchronization with the edges EG1b, EG4b, EG8b of the oscillator signal OSC, respectively.

With the above control, the supply ability of the internal voltage VPP by the internal voltage generating circuit 110 is stepwise reduced. In the example shown in FIG. 13, the speed at which the supply ability of the internal voltage VPP is reduced is still slower than in the example shown in FIG. 12. This is because the voltage of the external voltage VDD in the example shown in FIG. 13 is still lower than that in the example shown in FIG. 12 and thus, fluctuations of the internal voltage VPP can be decreased by reducing the supply ability of the internal voltage VPP more slowly.

According to the present embodiment, as described above, when the internal voltage generating circuit 110 is activated, the supply ability of the internal voltage VPP is stepwise increased and also the speed at which the supply ability is increased is made slower with an increasing level of the external voltage VDD detected by the voltage detection circuit unit 330, that is, in increasing proximity to the internal voltage VPP and therefore, when the external voltage VDD is high, sharp fluctuations of the internal voltage VPP can be prevented and when the external voltage VDD is low, the internal voltage VDD can be raised to a desired level swiftly.

When the internal voltage generating circuit 110 is inactivated, the supply ability of the internal voltage VPP is stepwise reduced and also the speed at which the supply ability is reduced is made faster with an increasing level of the external voltage VDD detected by the voltage detection circuit unit 330, that is, in increasing proximity to the internal voltage VPP and therefore, when the external voltage VDD is high, an excessive rise of the internal voltage VPP can be prevented and when the external voltage VDD is low, sharp fluctuations of the internal voltage VDD can be prevented.

It is apparent that the present invention is not limited to the above embodiments, but may be modified and changed without departing from the scope and spirit of the invention.

In the above embodiment, for example, the internal voltage generating circuit 110 contains the three stages 200, 210, 220, but the number of stages contained in the internal voltage generating circuit is not limited to three and any number that allows a stepwise increase in ability or a stepwise reduction in ability may be used. Therefore, a configuration in which the number of stages contained in the internal voltage generating circuit is one and the supply ability of the stage can be switched to a plurality of levels may be used.

In the above embodiment, each of the stages 200, 210, 220 has the high-ability mode and the low-ability mode, but such mode switching is not required as long as a stepwise increase in ability or a stepwise reduction in ability can be implemented.

Further, in the above embodiment, the phase of the oscillator signal OSC supplied to the activation circuits 230, 240, 250 is shifted, but this is not required in the present invention and the precisely identical signal may be supplied to the activation circuits 230, 240, 250. However, it is better to use the oscillator signals OSC with shifted phases to be able to prevent sharp fluctuations of the internal voltage VPP and to reduce power supply noise accompanying a pumping operation.

Further, the above embodiment is described by taking a case when the internal voltage VPP is generated by stepping up the external voltage VDD as an example, but conversely, a negative potential VBB can be generated by stepping up the ground potential VSS in the negative direction.

The technical idea of the present application can be applied to an internal voltage generating circuit that generates a positive voltage and a negative voltage. Whether pumping action is involved or not is not limited. Further, circuit types in each circuit block and other circuits generating control signals disclosed in the drawings are not limited to the circuit types disclosed by the above embodiment.

When the transistors are field effect transistors (FETs), various FETs are applicable, including MIS (Metal Insulator Semiconductor) and TFT (Thin Film Transistor) as well as MOS (Metal Oxide Semiconductor). The device may even include bipolar transistors. For example, the present invention can be applied to a general semiconductor device such as a CPU (Central Processing Unit), an MCU (Micro Control Unit), a DSP (Digital Signal Processor), an ASIC (Application Specific Integrated Circuit), and an ASSP (Application Specific Standard Circuit), each of which includes a memory function. An SOC (System on Chip), an MCP (Multi Chip Package), and a POP (Package on Package) and so on are pointed to as examples of types of semiconductor device to which the present invention is applied. The present invention can be applied to the semiconductor device that has these arbitrary product form and package form.

When the transistors are field effect transistors (FETs), various FETs are applicable, including MIS (Metal Insulator Semiconductor) and TFT (Thin Film Transistor) as well as MOS (Metal Oxide Semiconductor). The device may even include bipolar transistors.

In addition, an NMOS transistor (N-channel MOS transistor) is a representative example of a first conductive transistor, and a PMOS transistor (P-channel MOS transistor) is a representative example of a second conductive transistor.

Many combinations and selections of various constituent elements disclosed in this specification can be made within the scope of the appended claims of the present invention. That is, it is needles to mention that the present invention embraces the entire disclosure of this specification including the claims, as well as various changes and modifications which can be made by those skilled in the art based on the technical concept of the invention.

What is claimed is:

1. A semiconductor device comprising:
an oscillation circuit configured to produce an oscillator signal;
an internal voltage generating circuit including first and second charge pump circuits each including an output node coupled to a common node;
a first control circuit configured to receive the oscillator signal and produce a first control signal and a second control signal;
a second control circuit configured to receive the oscillator signal and the first control signal to operate the first charge pump circuit; and
a third control circuit configured to receive the oscillator signal and the second control signal to operate the second charge pump circuit, wherein the first control signal includes a first activation signal to activate the first charge pump circuit and a first inactivation signal to inactivate the first charge pump circuit, wherein the second control signal includes a second activation signal to activate the second charge pump circuit and a second inactivation signal to inactivate the second charge pump circuit, and wherein the first control circuit is configured to produce the first and second activation signals independently to each other, and produce the first and second inactivation signals independently to each other.

2. The semiconductor device as claimed in claim 1, wherein timings of the first and second activation signals are different from timings of the first and second inactivation signals.

3. The semiconductor device as claimed in claim 2, wherein the timings of the first and second activation signals are changed based on a voltage inputted from an outside of the semiconductor device.

4. The semiconductor device as claimed in claim 3, wherein the timings of the first and second inactivation signals are changed based on the voltage inputted from the outside of the semiconductor device.

5. A semiconductor device comprising:
an oscillation circuit configured to produce an oscillator signal;
an internal voltage generating circuit including first and second charge pump circuits each including an output node coupled to a common node;
a first control circuit configured to receive the oscillator signal and produce a first control signal and a second control signal;
a second control circuit configured to receive the oscillator signal and the first control signal to operate the first charge pump circuit;
a third control circuit configured to receive the oscillator signal and the second control signal to operate the second charge pump circuit; and
a first voltage detection circuit configured to detect an external voltage and produce a third control signal which is applied to the first control circuit.

6. The semiconductor device as claimed in claim 5, the semiconductor device further comprising:
a second voltage detection circuit configured to detect an internal voltage on the common node and produce a fourth control signal which is applied to the oscillation circuit.

7. A semiconductor device comprising:
an oscillation circuit configured to produce an oscillator signal;
an internal voltage generating circuit including first and second charge pump circuits each including an output node coupled to a common node;
a first control circuit configured to receive the oscillator signal and produce a first control signal and a second control signal;
a second control circuit configured to receive the oscillator signal and the first control signal to operate the first charge pump circuit; and
a third control circuit configured to receive the oscillator signal and the second control signal to operate the second charge pump circuit, wherein the first control circuit further produces a fourth control signal and a fifth control signal applied to the first and second charge pump circuits, respectively, to control the first and second charge pumps to change an ability supplying a power source voltage to the common node by the respective first and second charge pump circuits.

8. The semiconductor device as claimed in claim 7, wherein changing the ability is based on a voltage level of a voltage supplied from an outside of the semiconductor device.

9. A semiconductor device comprising:
an oscillation circuit configured to produce an oscillator signal;
an internal voltage generating circuit including first and second charge pump circuits each including an output node coupled to a common node;
a first control circuit configured to receive the oscillator signal and produce a first control signal and a second control signal;
a second control circuit configured to receive the oscillator signal and the first control signal to operate the first charge pump circuit; and
a third control circuit configured to receive the oscillator signal and the second control signal to operate the second charge pump circuit,
wherein the first control circuit comprises:
a counter circuit producing a plurality of selection signals; and
a selection circuit receiving the plurality of selection signals to produce the first and second control signals.

10. The semiconductor device as claimed in claim 9, wherein the counter circuit comprises:
a start counter circuit producing a first group of the plurality of selection signals, the selection signals of the first group being different in timing to one another; and
an exit counter circuit producing a second group of the plurality of selection signals, the selection signals of the second group being different in timing to one another.

11. The semiconductor device as claimed in claim 10, wherein the selection circuit comprises:
a first group of selectors each receiving corresponding ones of the first group of the selection signals to selectively output one of the ones of the first group of the selection signals; and
a second group of selectors each receiving corresponding ones of the second group of the selection signals to selectively output one of the ones of the second group of the selection signals.

12. The semiconductor device as claimed in claim 9, wherein the counter circuit is reset when a count value thereof exceeds a predetermined value.

13. The semiconductor device as claimed in claim 12, wherein the first control circuit maintains an active state of the oscillator until the counter circuit is reset.

* * * * *